US010743446B2

(12) United States Patent
Tanaka et al.

(10) Patent No.: US 10,743,446 B2
(45) Date of Patent: Aug. 11, 2020

(54) COMPONENT TAPE FEEDER WITH REEL DISPLACING MECHANISM

(71) Applicant: FUJI CORPORATION, Chiryu-shi (JP)

(72) Inventors: Keita Tanaka, Takahama (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 477 days.

(21) Appl. No.: 15/526,579

(22) PCT Filed: Nov. 17, 2014

(86) PCT No.: PCT/JP2014/080349
§ 371 (c)(1),
(2) Date: May 12, 2017

(87) PCT Pub. No.: WO2016/079785
PCT Pub. Date: May 26, 2016

(65) Prior Publication Data
US 2017/0339807 A1 Nov. 23, 2017

(51) Int. Cl.
H05K 13/04 (2006.01)
(52) U.S. Cl.
CPC ..... H05K 13/0417 (2013.01); H05K 13/0419 (2018.08)
(58) Field of Classification Search
CPC .......... H05K 13/0417; H05K 13/0419; H05K 13/0439
See application file for complete search history.

(56) References Cited

U.S. PATENT DOCUMENTS

| 5,873,691 A * | 2/1999 | Asai ............... H05K 13/0417 414/416.01 |
| 6,189,206 B1 * | 2/2001 | Asai ............... H05K 13/0417 29/740 |
| 6,260,260 B1 * | 7/2001 | Suhara ........... H05K 13/0417 29/740 |

(Continued)

FOREIGN PATENT DOCUMENTS

| JP | 8-250893 A | 9/1996 |
| JP | 2008-78413 A | 4/2008 |

(Continued)

OTHER PUBLICATIONS

International Search Report dated Jan. 13, 2015, in PCT/JP2014/080349, filed Nov. 17, 2014.

(Continued)

Primary Examiner — Peter Dungba Vo
Assistant Examiner — Jeffrey T Carley
(74) Attorney, Agent, or Firm — Oblon, McClelland, Maier & Neustadt, L.L.P.

(57) ABSTRACT

A reel holder on which is loaded tape reel is held on feeder main body of tape feeder so as to be displaceable in the width direction of feeder main body by link mechanism. By this, it is possible to displace the position of tape reel of tape feeder set on feeder setting table of a component mounter in the width direction of feeder main body based on the reel width of tape reel of an adjacent tape feeder, and tape reel of each tape feeder can be arranged making efficient use of the empty space between adjacent tape feeders.

2 Claims, 14 Drawing Sheets

(56) References Cited

U.S. PATENT DOCUMENTS

| | | | | |
|---|---|---|---|---|
| 6,491,250 B1 * | 12/2002 | Asai | ................... | H05K 13/0417 |
| | | | | 242/559.1 |
| 6,665,928 B2 * | 12/2003 | Suhara | ............... | H05K 13/0417 |
| | | | | 29/834 |
| 7,681,617 B2 * | 3/2010 | Arrighi | .............. | H05K 13/0417 |
| | | | | 156/760 |
| 7,836,931 B2 * | 11/2010 | Slyne | ................... | B29C 70/388 |
| | | | | 156/350 |
| 8,171,620 B2 * | 5/2012 | Yonemitsu | ......... | H05K 13/0419 |
| | | | | 29/822 |
| 2002/0003994 A1 * | 1/2002 | Davis | ............... | H01L 21/67144 |
| | | | | 414/225.01 |
| 2007/0169436 A1 * | 7/2007 | Arrighi | .............. | H05K 13/0417 |
| | | | | 53/452 |

FOREIGN PATENT DOCUMENTS

| | | |
|---|---|---|
| JP | 2008-130851 A | 6/2008 |
| JP | 2012-248784 A | 12/2012 |
| JP | 2014-82249 A | 5/2014 |
| WO | 2014/097389 A1 | 6/2014 |

OTHER PUBLICATIONS

Extended European Search Report dated May 30, 2018 in Patent Application No. 14906375.2.

\* cited by examiner (a) Plan view (b) Side view

Prior Art (number two)

(a) Plan view (b) Side view

COMPONENT TAPE FEEDER WITH REEL DISPLACING MECHANISM

TECHNICAL FIELD

The present application relates to a tape feeder and a component mounter with an improved tape reel holding construction.

BACKGROUND ART

With conventional tape feeders, as disclosed in patent literature 1 (JP-A-2008-130851), multiple slots for setting multiple tape feeders are formed on a feeder setting table of a component mounter, and tape feeders are configured to be able to be set in each of the slots.

Also, as disclosed in patent literature 2 (WO2014/097389), reel widths vary based on the size of the component to be supplied (the width of the component supply tape), and feeder widths vary based on the reel width; in addition to narrow feeders with a feeder width that occupies one slot pitch, there are wide feeders with a feeder width larger than one slot pitch, therefore, when setting multiple tape feeders with different feeder widths in slots lined up in a row, the quantity of slots occupied by the tape feeders changes based on the feeder widths, and the quantity of tape feeders that can be set on the feeder setting table varies.

For example, as shown in FIG. 10(b), when loading narrow tape feeders that have a feeder width (reel width) equal to or smaller than the slot pitch on the feeder setting table, the same quantity of tape feeders as there are slots on the feeder setting table can be loaded; however, as shown in FIG. 10(a), when loading wide tape feeders that have a feeder width (reel width) wider than the slot pitch on the feeder setting table, even though the feeder width is only slightly larger than the slot pitch, only half the quantity of tape feeders as there are slots can be loaded, meaning that there is a lot of wasted space on the feeder setting table.

Also, as shown in FIG. 11, when using a feeder setting table with a slot pitch formed to match the feeder width of the wide tape feeders, only the same quantity of narrow tape feeders and wide tape feeders can be loaded, and there is still a lot of wasted space on the feeder setting table.

CITATION LIST

Patent Literature

Patent literature 1: JP-A-2008-130851
Patent literature 2: WO2014/097389
Patent literature 3: JP-A-2008-78413

SUMMARY

Generally, because component mounting lines are configured with multiple component mounters arranged along a conveyance path of a circuit board, if the quantity of tape feeders that can be loaded on the feeder setting tables of each of the component mounters can be increased, the quantity of component mounters that configure the component mounting line can be reduced, thereby saving space and reducing the cost of the component mounting line.

However, as given above, with conventional configurations, different feeder widths give rise to a lot of wasted space on the feeder setting table, meaning that the demands for saving space and reducing costs are not satisfied.

Note that, with the component mounter disclosed in patent literature 3 (JP-A-2008-78413), by arranging the positions of the tape reels of the multiple tape feeders loaded on the feeder setting table shifted alternately in the front-rear direction (the attachment and removal direction of the tape feeders), tape reels of adjacent tape feeders do not interfere with each other (overlap), meaning that even for tape feeders loaded with wide tape reels, the same quantity as tape feeders loaded with narrow reels can be set on the feeder setting table.

However, with the configuration in patent literature 3, because the positions of the tape reels of the multiple tape feeders loaded on the feeder setting table are shifted alternately in the front-rear direction, the overall dimension in the front-rear direction of tape feeders including tape reels is increased greatly, meaning that the goal of saving space is not achieved.

Therefore, an object of the present disclosure is to provide a tape feeder and a component mounter that achieves both cost reduction and space saving.

To solve the above problem, the present disclosure is a tape feeder including: a feeder main body on which is set a tape reel on which is wound component supply tape; and a reel displacing mechanism provided on the feeder main body configured to displace the tape reel in a width direction of the feeder main body. With this configuration, by displacing the position of a tape reel of a tape feeder set on a feeder setting table of a component mounter in the width direction of the feeder main body based on the reel width of the tape reel of an adjacent tape feeder, the tape reel of each tape feeder can be arranged making efficient use of the empty space between adjacent tape feeders. By this, it is possible to increase the quantity of tape feeders that can be loaded on the feeder setting table without increasing the overall dimension in the front-rear direction of the tape feeder, meaning that the quantity of component mounters that configure the component mounting line can be reduced, thereby achieving space saving and reduced costs of the component mounting line.

The present disclosure may drive the reel displacing mechanism that displaces the tape reel in the width direction of the feeder main body with a drive source such as a motor or a cylinder, but this configuration complicates the configuration of the reel displacing mechanism and brings about increased costs.

With respect to this, the reel displacing mechanism may be configured to displace the tape reel in the width direction of the feeder main body via an external force. Accordingly, because a drive source is not required for the reel displacing mechanism, the configuration of the reel displacing mechanism is simple and costs are reduced.

The present disclosure of a tape feeder may be configured such that a tape reel with a reel width larger than the width of the feeder main body is set on the feeder main body, and the reel displacing mechanism may displace the tape reel in the width direction of the feeder main body between a position in which only one of the side surface portions of the tape reel from among both the side surface portions of the tape reel protrudes from a side surface of the feeder main body, and a position in which the other side surface of the tape reel protrudes from the other side surface of the feeder main body. Accordingly, it is possible to use empty space on both sides of adjacent tape feeders loaded on the feeder setting table efficiently as tape reel arranging space.

In this case, the reel displacing mechanism may be configured to hold a reel holder displaceably in the width direction of the feeder main body, the reel holder holding the tape reel rotatably, the tape feeder may be attached by being inserted into one of multiple slots of a feeder setting table of a component mounter, a slide taper section may be formed on both end portions in the front to rear direction of the reel holder, and, the configuration may be such that, when a second tape feeder is inserted into a slot adjacent to a first tape feeder that has been inserted into a slot of the feeder setting table, after inserting the second tape feeder to a position such that the front end section of the second tape feeder contacts the slide taper section on the rear side of the reel holder of the first tape feeder thereby pushing the reel holder of the first tape feeder to a position that allows the second tape feeder to be inserted, the second tape feeder is inserted to a position such that the front side slide taper section of the reel holder of the second tape feeder contacts the rear end section of the first tape feeder thereby pushing the reel holder of the second tape feeder to a position that allows the second feeder to be inserted. Accordingly, when an operator inserts a tape feeder into a slot on the feeder setting table, tape feeder attachment work is easy as there is no need to perform displacing of the position of the tape reel in the width direction of the feeder main body in advance.

Also, the reel displacing mechanism may be configured using a link mechanism. According to this, the configuration of the reel displacing mechanism is simple, and displacing operation can be performed smoothly via an external force.

As an embodiment of the present disclosure, for example, the width of the feeder main body of the tape feeder may be set to be narrower than the pitch of the slots, the width of the tape reel may be set to be wider than the pitch of the slots but no wider than 1.5 times the pitch of the slots, and, the configuration may be such that, when the tape feeder is inserted into the slot, two of the tape feeders are inserted into two of the slots that are adjacent to each other, the slots on both sides of the two adjacent slots are left empty, and the tape reels of the two tape feeders inserted into the two adjacent slots protrude into the empty slots respectively. Accordingly, two tape feeders loaded with wide tape reels can be loaded in a three-slot pitch of the feeder setting table. Accordingly, for example, it is possible to load twenty tape feeders loaded with wide tape reels to a thirty-slot feeder setting table.

DESCRIPTION OF EMBODIMENTS

Figure 1:
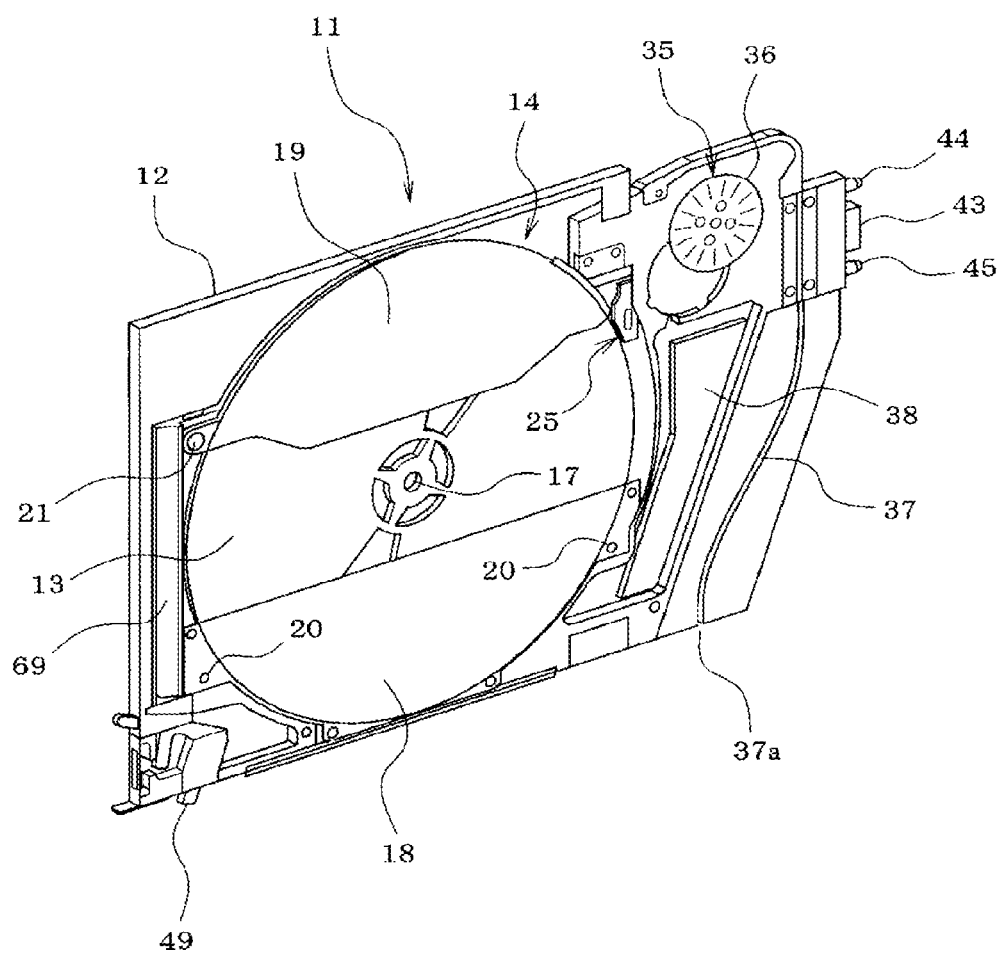
FIG. 1 is a perspective view showing a tape feeder of a first embodiment of the present disclosure.

Descriptions of two embodiments for carrying out the present disclosure are given below.

First Embodiment

A first embodiment of the present disclosure will be described using FIGS. 1 to 9 and FIGS. 12 to 14. Described first is the configuration of tape feeder 11.

Feeder main body 12 of tape feeder 11 is formed as a flat case. Reel holder 14, which rotatably holds tape reel 13 on which component supply tape is wound, is provided on feeder main body 12 via link mechanism 15 (reel displacing mechanism) so as to be displaceable in the width direction (X direction) of feeder main body 12.

Figure 2:
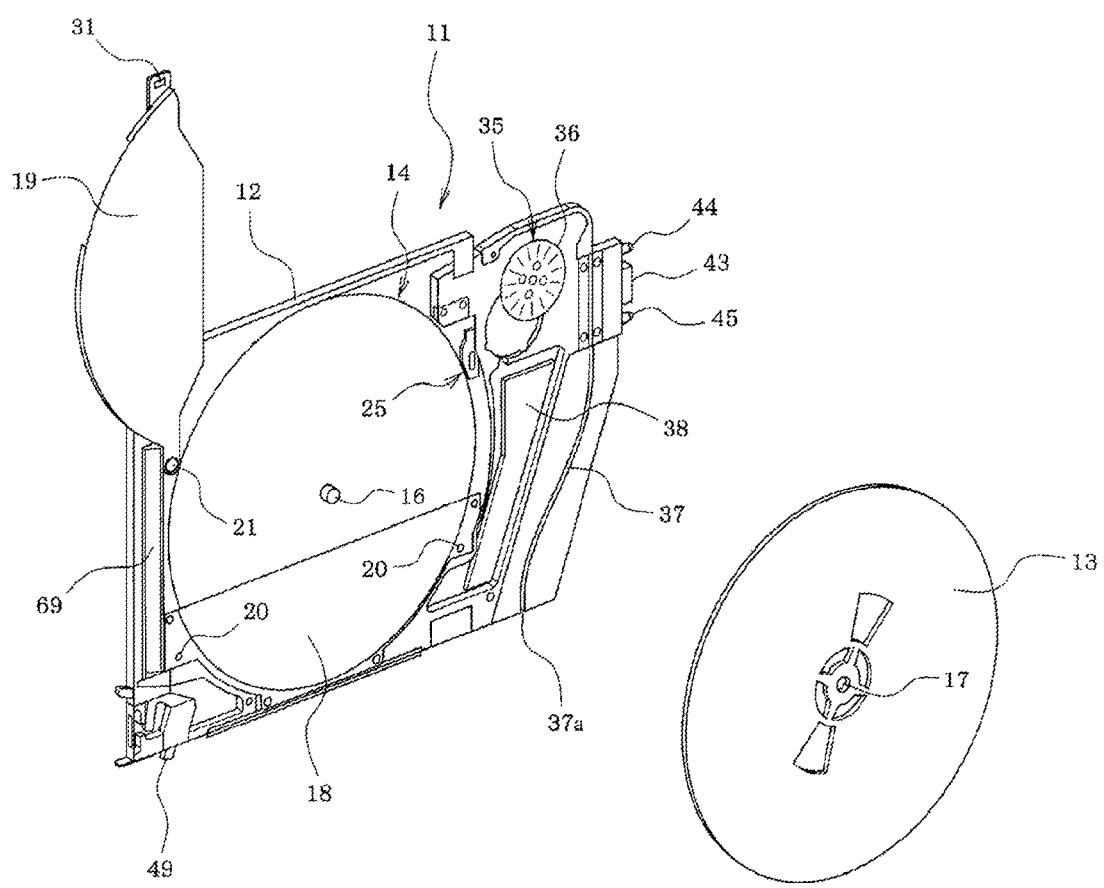
FIG. 2 is a perspective view showing the tape feeder with the tape reel removed.

As shown in FIG. 2, center hole 17 of tape reel 13 is rotatably supported on reel holding shaft 16 provided in a center section of reel holder 14. Reel holding shaft 16 is short, and tape reel 13 can be attached to and removed from reel holding shaft 16 by slightly tilting center hole 17 of tape reel 13. Lower section cover 18 that covers a lower section of tape reel 13 attached to reel holding shaft 16 and upper section cover 19 that covers an upper section of tape reel 13 are provided on reel holder 14. Lower section cover 18 is fixed to reel holder 14 by screws 20 and so on; upper section cover 19 is supported on reel holder 14 via shaft 21 so as to be able to be rotated open and closed; when tape reel 13 is attached or removed, if upper section cover 19 is opened, center hole 17 of tape reel 13 can be attached to or removed from reel holding shaft 16 by slightly tilting tape reel 13.

Figure 8:
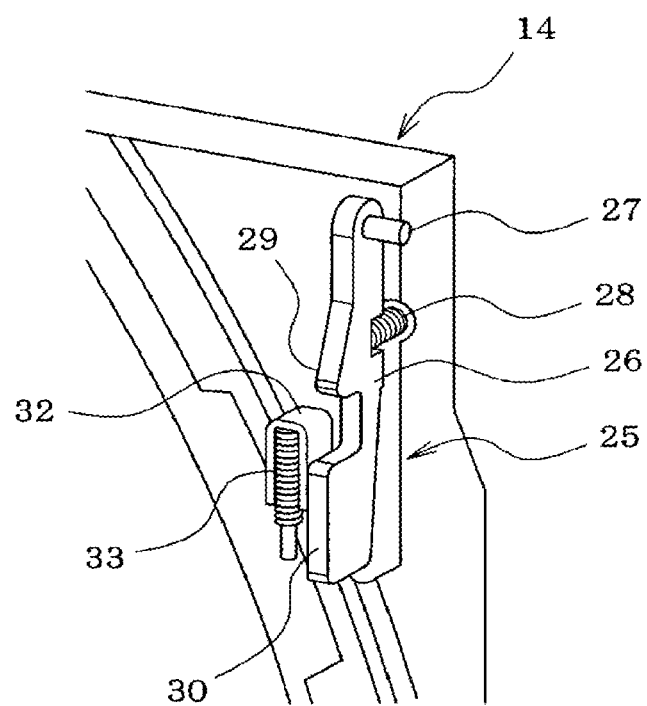
FIG. 8 is an enlarged perspective view showing the configuration of a lock mechanism that engages and holds a reel cover in a closed position.
Figure 9:
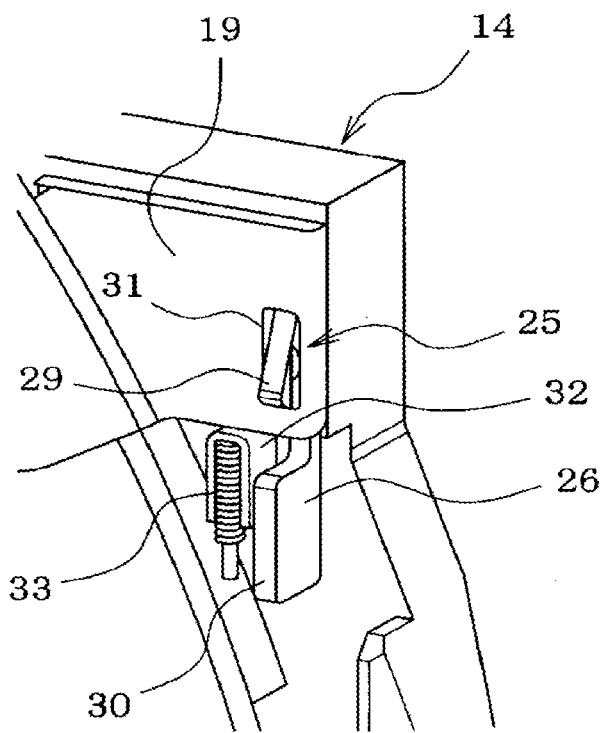
FIG. 9 is an enlarged perspective view showing a state in which the reel cover is engaged and held by the lock mechanism.
Figure 10:
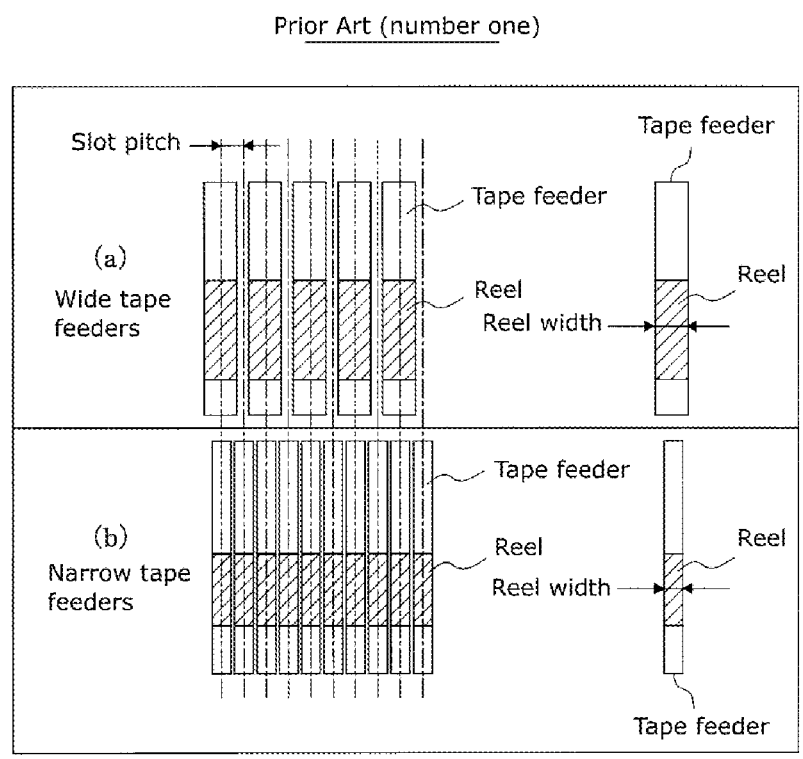
FIGS. 10(a) and 10(b) illustrate the relationship between the slot pitch of a feeder setting table and the width of tape feeders in a conventional example (number one).
Figure 11:
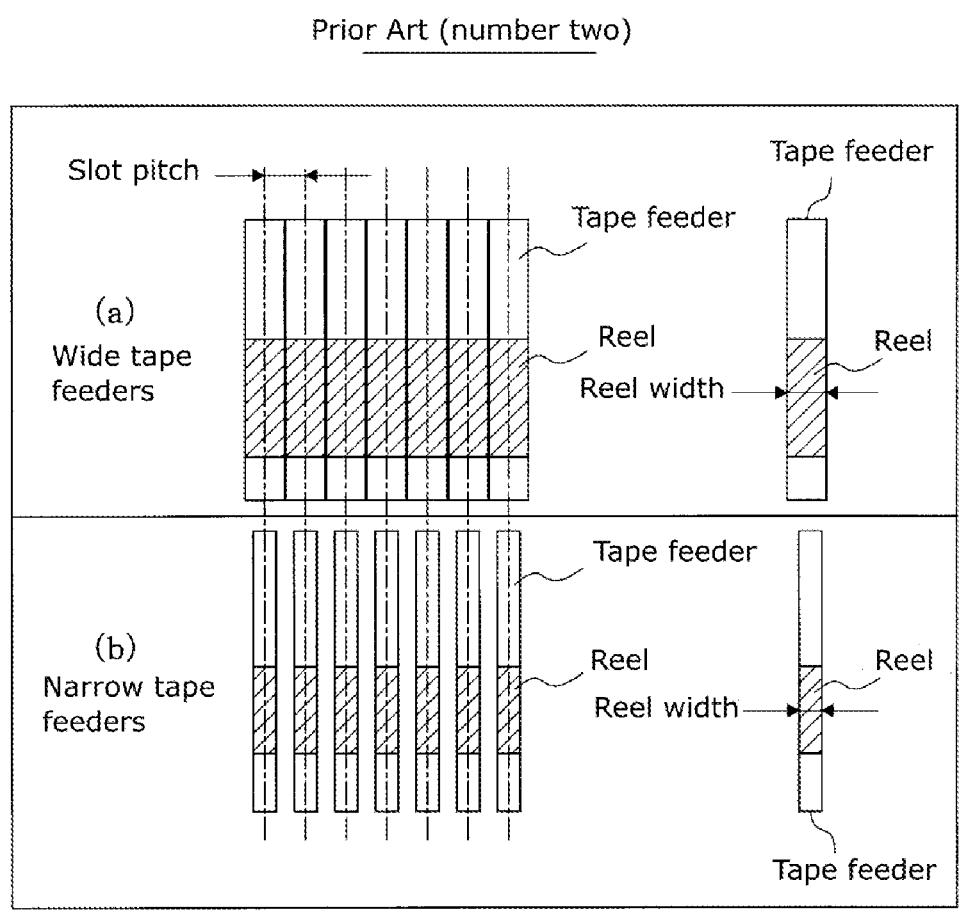
FIGS. 11(a) and 11(b) illustrate the relationship between the slot pitch of a feeder setting table and the width of tape feeders in a conventional example (number two).
Figure 12:
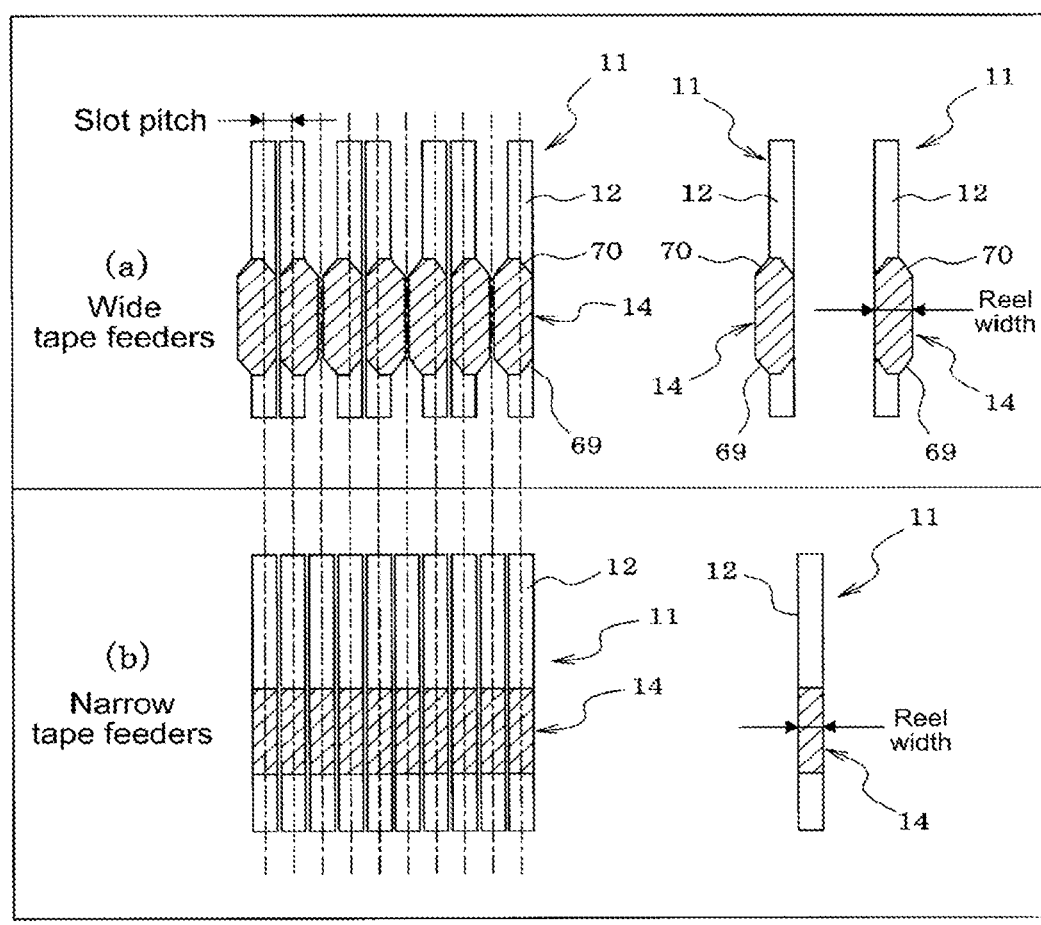
FIGS. 12(a) and 12(b) illustrate the relationship between the slot pitch of a feeder setting table and the width of tape feeders in the first embodiment.

Lock mechanism 25 that locks upper section cover 19 in a closed state is provided on reel holder 14. As shown in FIGS. 8 and 9, the specific configuration of lock mechanism 25 is such that an upper end section of lock lever 26 is rotatably supported on the reel holder 14 side via shaft 27, and lock bar 26 is biased forwards by the elastic force of spring 28; when upper section cover 19 is open (when the lock is released), lock bar 26 is held in the lock release position shown in FIG. 8 by the elastic force of spring 28. Engaging protrusion 29 with a right-angled triangle shape and lock release operation section 30 are formed on lock bar 26 with a vertical relative positional relationship and protruding to the front side. Engaging hole 31 that engages with engaging protrusion 29 of lock bar 26 is formed in an end section of upper section cover 19.

When an operator rotates upper section cover 19 to the closed position (locked position), the circumferential edge portion of engaging hole 31 of upper section cover 19 contacts the inclined surface of engaging protrusion 29 of lock bar 26 in front of the closed position, and when upper section cover 19 is rotated to the closed position while being pushed against the elastic force of spring 28, at that closed position, engaging hole 31 of upper section cover 19 engages with engaging protrusion 29 of lock bar 26, lock bar 26 is pushed out by the elastic force of spring 28 such that engaging protrusion 29 of lock bar 26 enters engaging hole 31 of upper section cover 19, such that upper section cover 19 is locked in the closed position.

Cover retainer 32 that helps lock releasing operation of upper section cover 19 is provided next to lock bar 26 to be movable vertically, and cover retainer 32 is biased upwards by the elastic force of spring 33. When upper section cover 19 is closed (locked), cover retainer 32 contacts the lower edge of upper section cover 19 due to the elastic force of spring 33, such that the lower edge of engaging hole 31 of upper section cover 19 is held in a state contacting the lower edge of engaging protrusion 29 of lock lever 26. When opening upper section cover 19, when an operator uses a fingertip to perform push operation of lock release operation section 30 of lock lever 26, such that lock lever 26 is pushed in against the elastic force of spring 28, engaging protrusion 29 of lock lever 26 escapes from engaging hole 31 of upper section cover 19, the locking of upper section cover 19 is released, and at that point, upper section cover 19 is pushed up by cover retainer 32 due to the elastic force of spring 33 such that the lock release state is maintained.

As shown in FIGS. 1 and 2, tape feeding mechanism 35 that feeds the component supply tape which is pulled out from tape reel 13 to a component pickup position, and a cover tape peeling mechanism (not shown) that peels the top tape (cover tape) from the component supply tape forward from the component pickup position to expose components in the component supply tape are provided inside feeder main body 12. The component pickup position is in the vicinity of the end portion of the tape feeding direction side of the top surface of feeder main body 12.

Tape feeding mechanism 35 is formed from sprocket 36, which is provided in the vicinity below the component pickup position, and a motor (not shown) that drives sprocket 36 to rotate, and tape feed mechanism 35 pitch feeds component supply tape to the component pickup position by engaging the teeth of sprocket 36 with tape feeding holes which are formed in the edge of one side of the component supply tape at a predetermined pitch and then rotating sprocket 36.

Waste tape disposal path 37 used to discard waste tape (carrier tape from which cover tape has been peeled) that has passed the component pickup position and from which components have been removed by guiding the waste tape downwards is provided extending downwards on an edge portion of feeder main body 12 on the tape feeding direction side. Control board 38 that controls the motor of tape feeding mechanism 35 and the motor of the cover tape peeling mechanism is provided on feeder main body 12.

Connector 43 and two positioning pins 44 and 45 for connecting the signal wire and power wire of feeder main body 12 to connector 43 (refer to FIG. 14) of feeder setting table 41 of the component mounter are provided at the front end (end surface in the tape feeding direction) of feeder main body 12; by inserting the two positioning pins 44 and 45 into positioning holes 46 and 47 (refer to FIG. 14) of feeder setting table 41 of the component mounter, the attachment position of feeder main body 12 on feeder setting table 41 is decided, and connector 43 of feeder main body 12 is connected to connector 43 of feeder setting table 41.

Figure 14:
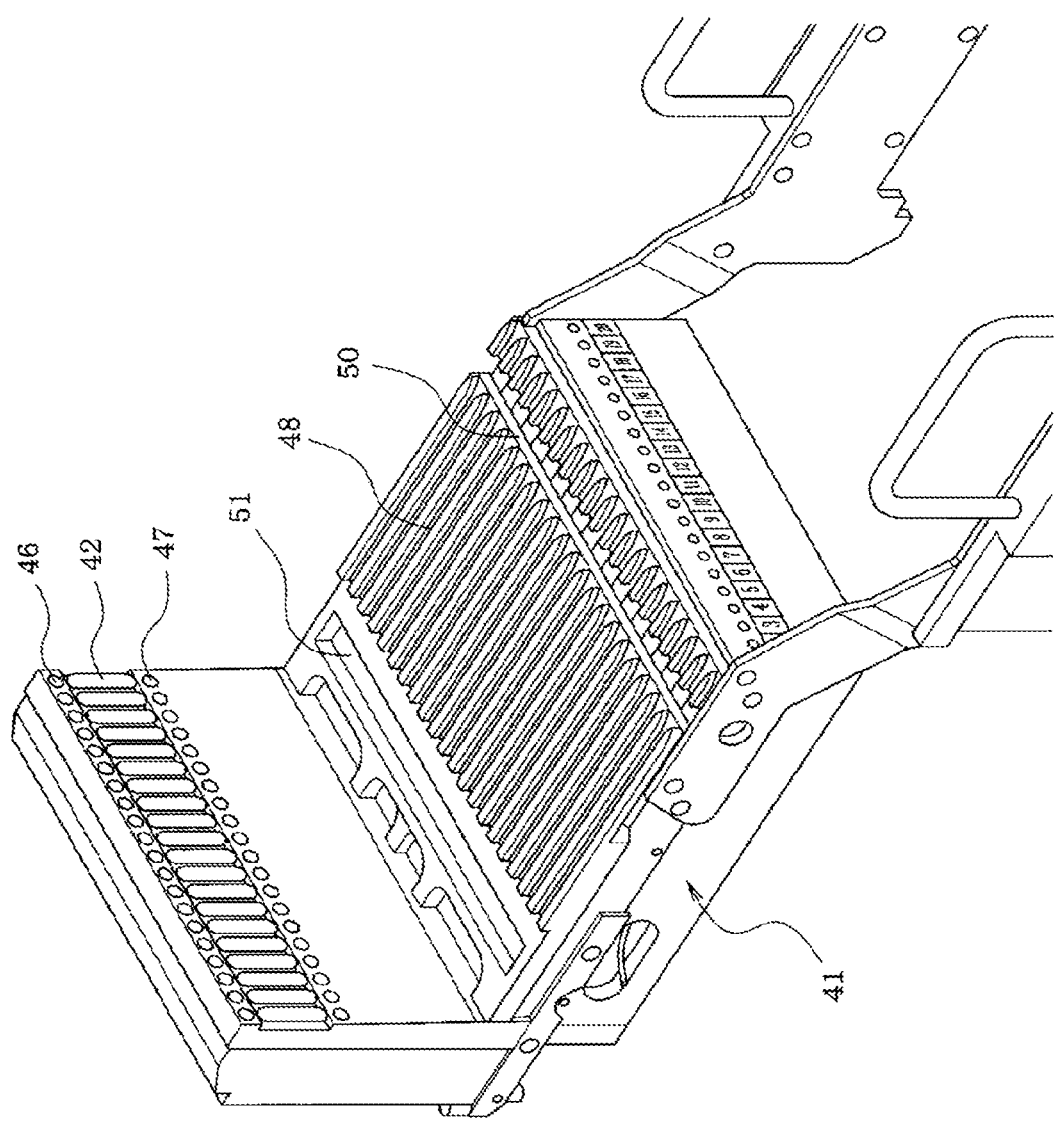
FIG. 14 is a perspective view showing the feeder setting table of a component mounter.

As shown in FIG. 14, in order to support tape feeder 11 in an upright position, slots 48 with an upside-down T-shaped cross section are provided on the upper surface of feeder setting table 41, and by inserting a guide rail (not shown) with an upside-down T-shaped cross section that is provided on the underside of feeder main body 12 into a slot 48 from the front, tape feeder 11 is supported on feeder setting table 41 in an upright position, and by clamping feeder main body 12 by pushing feeder main body 12 forward (to the side with connector 43 of feeder setting table 41) such that clamp member 49 (refer to FIGS. 1 and 2) provided on a lower section of feeder main body 12 is inserted into clamp groove 50 of feeder setting table 41, feeder main body 12 is positioned in the front-rear direction and attached on feeder setting table 41 in a removable manner. Waste tape disposal opening 51 is formed on feeder setting table 41 at a position facing exit 37a of waste tape disposal path 37 of feeder main body 12, and waste tape that has passed through waste tape disposal path 37 is discarded downwards from waste tape disposal opening 51.

Figure 3:
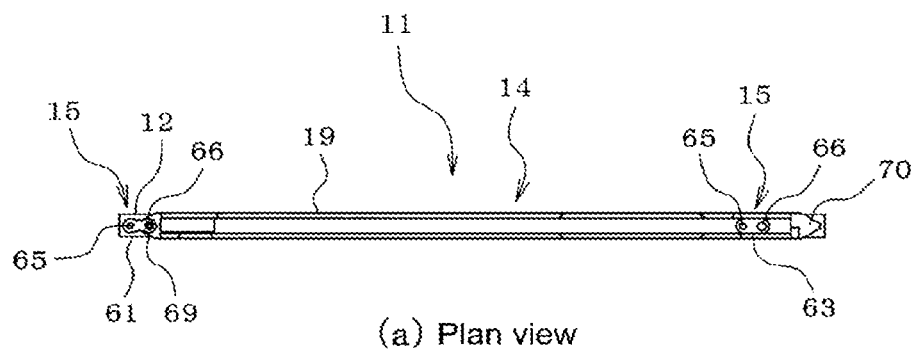
FIG. 3(a) is a plan view of the tape feeder and FIG. 3(b) is a side view of the tape feeder.
Figure 3:
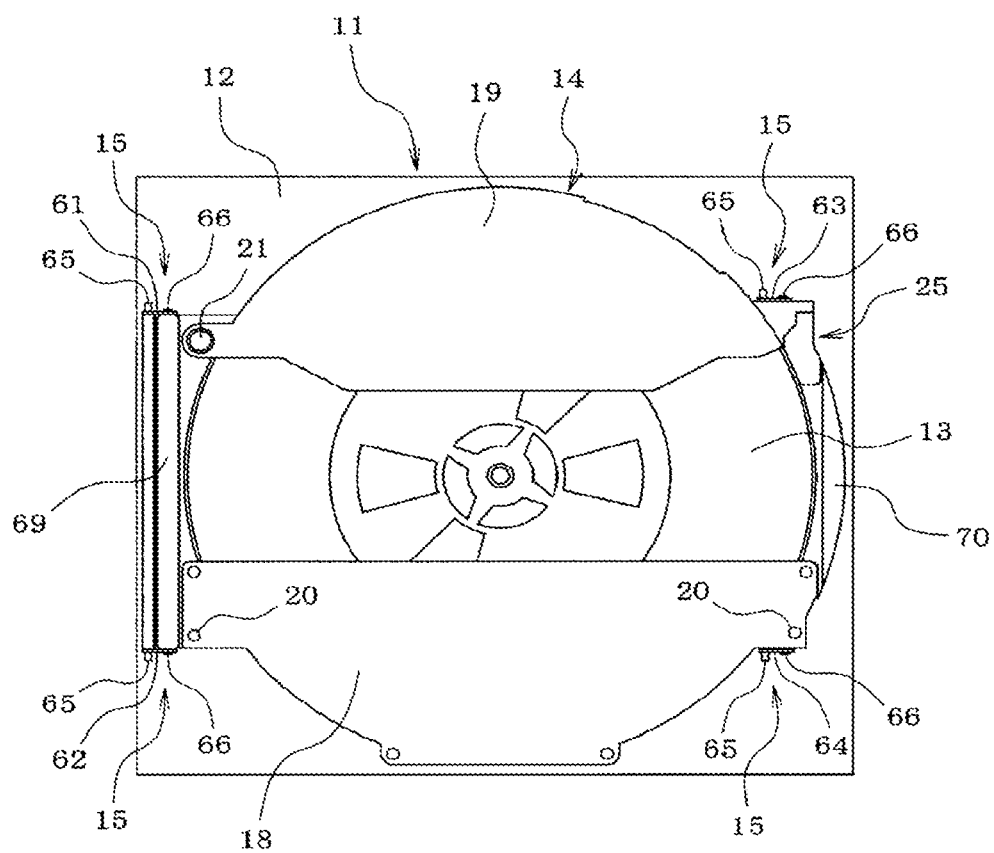
Figure 4:
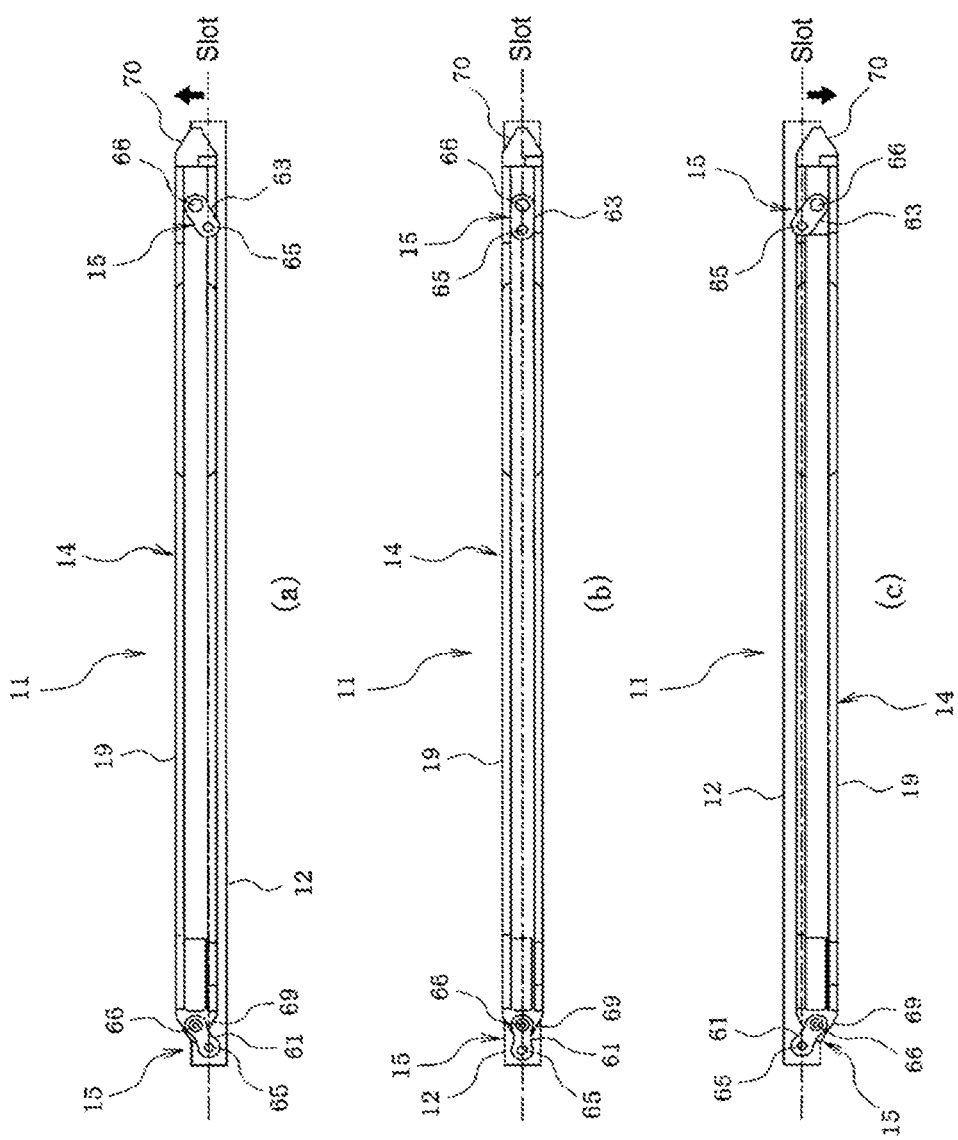
FIGS. 4(a) to 4(c) are plan views illustrating displacing operation of the position of a tape reel in the width direction of the feeder main body.
Figure 5:
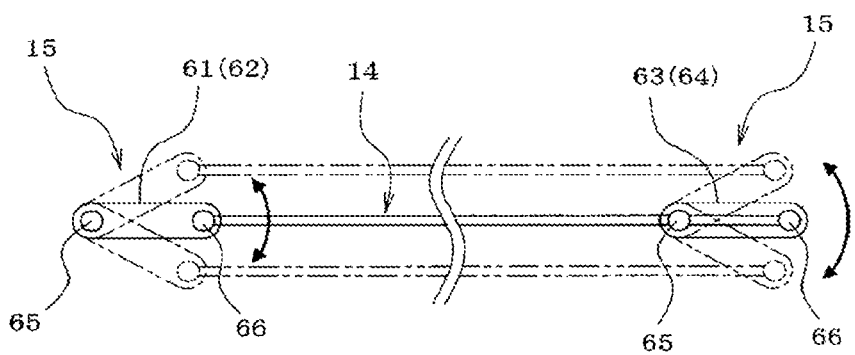
FIG. 5 is a plan view illustrating operation of a link mechanism that displaces the tape reel in the width direction of the feeder main body.
Figure 6:
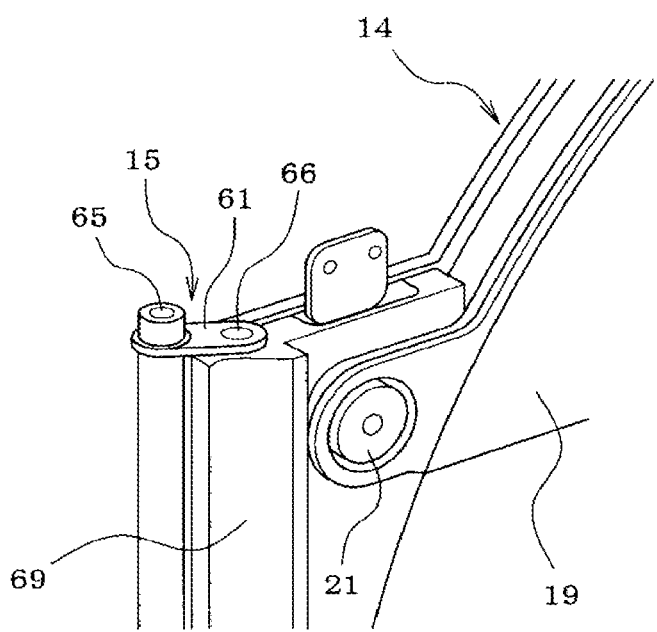
FIG. 6 is an enlarged perspective view showing the configuration of an upper section of the link mechanism on the front side (the removal direction side).
Figure 7:
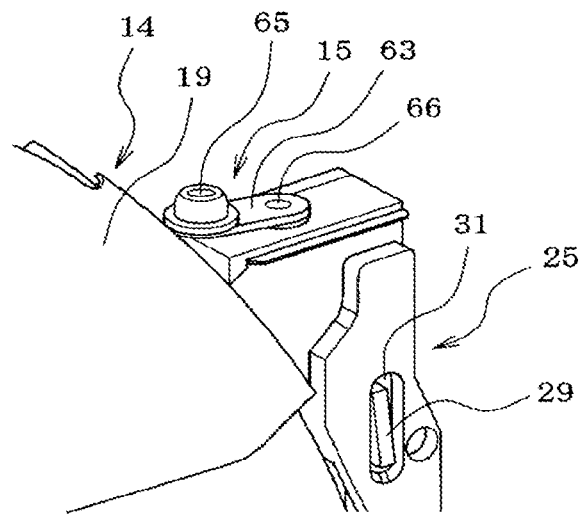
FIG. 7 is an enlarged perspective view showing the configuration of an upper section of the link mechanism on the rear side (the attachment direction side).

Next, the configuration of link mechanism 15 (reel displacing mechanism) that holds reel holder 14 so as to be displaceable in the width direction of feeder main body 12 will be described using FIGS. 3 to 7. In FIGS. 3 to 5, the left to right direction in each figure is the attachment direction of tape feeder 11 (the insertion direction onto slot 48), and the right to left direction in each figure is the removal direction of tape feeder 11 (the direction opposite to the insertion direction onto slot 48).

Link mechanism 15 is configured using a total of four links, 61 to 64, that hold the both the top and bottom sides of both end sections of reel holder 14 in the front-rear direction (the attachment and removal direction of tape feeder 11), and each link 61 to 64 is connected to feeder main body 12 and reel holder 14 by two shafts, 65 and 66, respectively. With each link 61 to 64, the shaft 65 on the removal direction side (the left side in FIGS. 3 to 5) is fixed to the feeder main body 12 side, and shaft 66 on the attachment direction side (the right side in FIGS. 3 to 5) is fixed to the reel holder 14 side. Accordingly, as shown in FIGS. 4 and 5, each link 61 to 64 is rotatably displaceable in the width direction of feeder main body 12 around shaft 65 on the removal direction side as a fulcrum, and reel holder 14 is displaceable in the width direction of feeder main body 12 by the rotational displacement of each link 61 to 64. Accordingly, tape reel 13 loaded in reel holder 14 is displaceable in the width direction of feeder main body 12 as one with reel holder 14 by the rotational displacement of each link 61 to 64.

Figure 13:
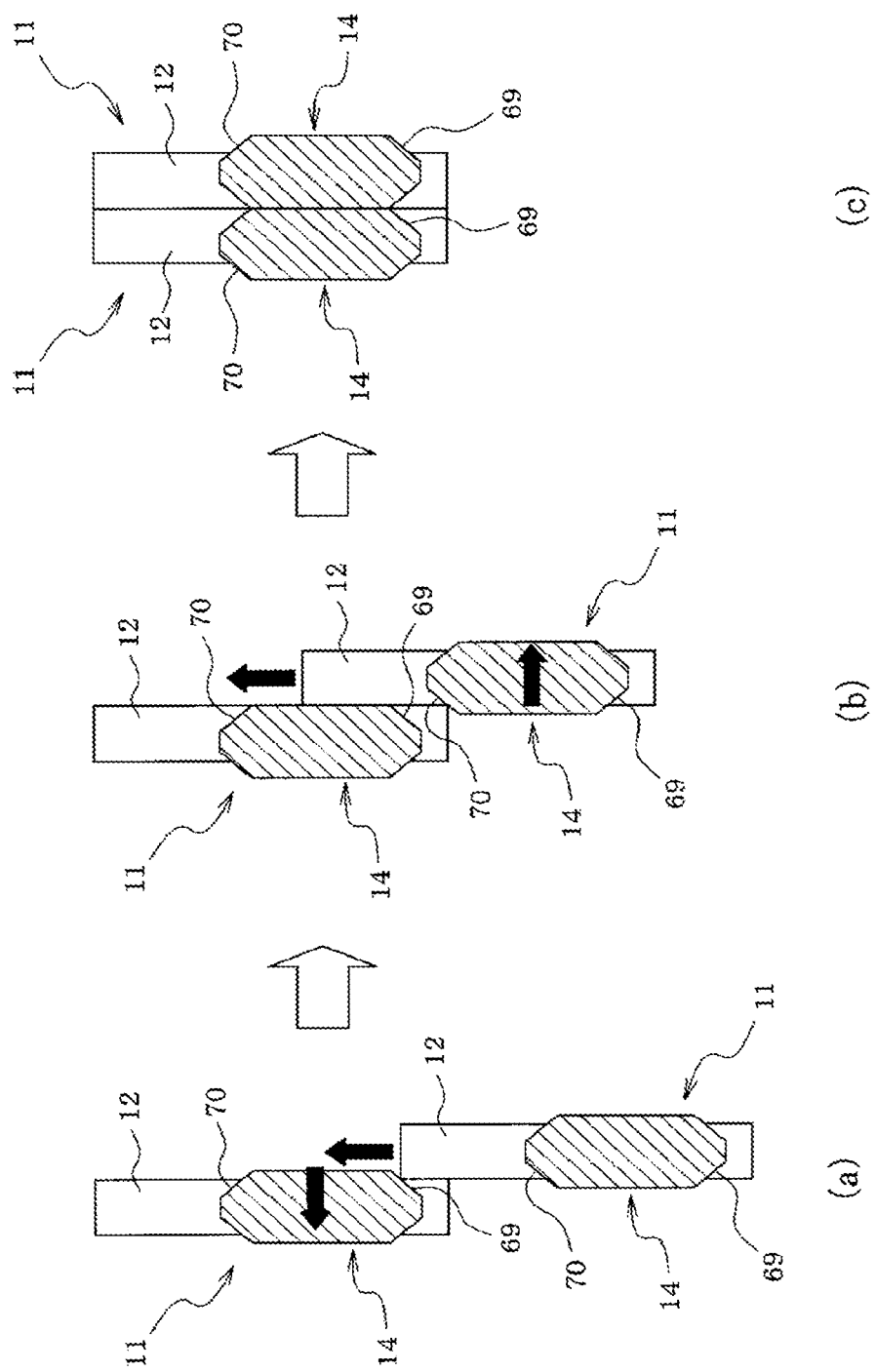
FIG. 13 is a plan view illustrating loading work of tape feeders to the feeder setting table of the first embodiment.

As shown in FIGS. 3, 4, 12, and 13, slide taper sections 69 and 70 with an approximately triangular cross section are formed at both end portions on reel holder 14 in the front-rear direction (the attachment and removal direction of tape feeder 11). Accordingly, for example, as shown in FIG. 13, when inserting a second tape feeder 11 into slot 48 adjacent on the right side to a tape feeder 11 inserted into another slot 48 on feeder setting table 41, as shown in FIG. 13, the front end of the second tape feeder 11 contacts slide taper section 69 on the rear side of the reel holder 14 of the tape feeder 11 adjacent to the left, and reel holder 14 of the tape feeder 11 adjacent to the left is pushed to the left to a position at which the second tape feeder 11 can be inserted.

Then, as shown in FIG. 13(b), slide taper section 70 on the front side of reel holder 14 on the second tape feeder 11 contacts the rear end section of the tape feeder 11 adjacent to the left pushing reel holder 14 of the tape feeder 11 adjacent to the left in the left direction to a position that allows the second tape feeder 11 to be inserted. By this, even in a case in which the reel width of tape reel 13 is wider than the width of feeder main body 12, as shown in FIG. 13(c), another tape feeder 11 can be inserted into a slot 48 adjacent to a slot 48 on feeder setting table 41 into which a tape feeder 11 has been inserted.

In the first embodiment, as shown in FIG. 12(a), the width of feeder main body 12 of tape feeder 11 is set to be narrower than the pitch of slots 48 on feeder setting table 41, and the reel width of tape reel 13 is set to be wider than the slot pitch but no wider than 1.5 times the slot pitch. By this, when inserting tape feeders 11 into slots 48, two tape feeders 11 are inserted into two adjacent slots 48, the slots 48 on both sides of the two adjacent slots 48 are left empty, and the tape reels 13 of the two tape feeders 11 inserted into the two adjacent slots 48 protrude into the respective adjacent empty slots. Accordingly, two tape feeders 11 loaded with wide tape reels 13 can be loaded in a three-slot pitch of feeder setting table 41. Accordingly, for example, it is possible to load twenty tape feeders 11 loaded with wide tape reels 13 to a thirty-slot feeder setting table 41.

Note that, as shown in FIG. 12(b), in a case in which both the width of feeder main body 12 of tape feeder 11 and the reel width of tape reel 13 are narrower than the pitch of slots 48 on feeder setting table 41, the quantity of tape feeders 11 that can be loaded on feeder setting table 41 is the same as the quantity of slots 48.

According to the first embodiment described above, because reel holder 14 on which is loaded tape reel 13 is held on feeder main body 12 of tape feeder 11 via link mechanism 15 so as to be displaceable in the width direction of feeder main body 12, by displacing the position of tape reel 13 of tape feeder 11 loaded on feeder setting table 41 of a component mounter in the width direction of feeder main body 12 based on the reel width of tape reel 13 of an adjacent tape feeder 11, the tape reel 13 of each tape feeder 11 can be arranged making efficient use of the empty space between adjacent tape feeders 11. By this, it is possible to increase the quantity of tape feeders 11 that can be loaded on feeder setting table 41 without increasing the overall dimension in the front-rear direction of tape feeder 11, meaning that the quantity of component mounters that configure the component mounting line can be reduced, thereby achieving space saving and reduced costs of the component mounting line.

Note that, link mechanism 15 (reel displacing mechanism) that displaces tape reel 13 in the width direction of feeder main body 12 may be driven with a drive source such as a motor or a cylinder, but this configuration complicates the configuration and brings about increased costs.

Here, in the first embodiment, the configuration is such that reel holder 14 on which tape reel 13 is loaded is displaced in the width direction of feeder main body 12 via an external force. With this configuration, a drive source for the reel displacing mechanism that displaces tape reel 13 in the width direction of feeder main body 12 is not required, thereby the configuration of the reel displacing mechanism is simple and costs are reduced.

Also, in the first embodiment, because the configuration is such that tape reel 13 with a reel width larger than the width of feeder main body 12 is set on feeder main body 12 of tape feeder 11, and tape reel 13 is displaced in the width direction of feeder main body 12 between a position in which only one of the side surface portions of tape reel 13 from among both the side surface portions of tape reel 13 protrudes from a side surface of feeder main body 12, and a position in which the other side surface of tape reel 13 protrudes from the other side surface of feeder main body 12, it is possible to use empty space on both sides of adjacent tape feeders 11 loaded on feeder setting table 41 efficiently as tape reel 13 arranging space.

Further, in the first embodiment, because the configuration is such that: slide taper sections 69 and 70 with an approximately triangular cross section are formed at both end portions on reel holder 14 in the front-rear direction, and, when a second feeder is inserted into a slot 48 adjacent to a slot 48 of feeder setting table 41 into which a first tape feeder 11 has been inserted, the second tape feeder 11 is inserted to a position such that the front end section of the second tape feeder 11 contacts slide taper section 69 on the rear side of reel holder 14 of the first tape feeder 11 thereby pushing reel holder 14 of the first tape feeder 11 to a position that allows the second tape feeder 11 to be inserted, and the second tape feeder 11 is inserted to a position such that the front side slide taper section 70 of reel holder 14 of the second tape feeder 11 contacts the rear end section of the first tape feeder 11 thereby pushing reel holder 13 of the second tape feeder 11 to a position that allows the second tape feeder 11 to be inserted; when an operator inserts a tape feeder 11 into a slot 48 on feeder setting table 41, it is not necessary to displace the position of tape reel 13 in the width direction of feeder main body 122 in advance, and attachment work of tape feeder 11 is easy.

Also, because link mechanism 15 is used for the reel displacing mechanism that displaces reel holder 14 in the width direction of feeder main body 12, the configuration of the reel displacing mechanism is simple, and there is an advantage in that displacing operation can be performed smoothly via an external force.

Second Embodiment

Figure 15:
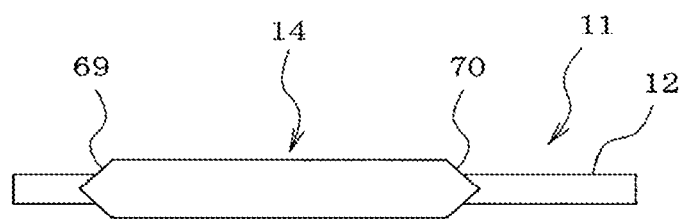
FIG. 15(a) is a plan view of the tape feeder of a second embodiment and FIG. 15(b) is a side view of the same tape feeder.
Figure 15:
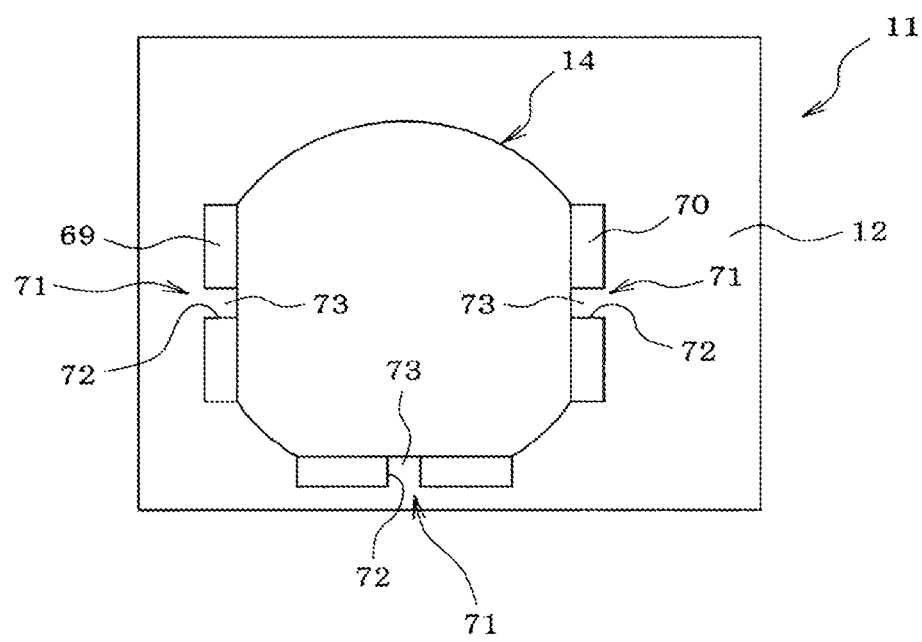
Figure 16:
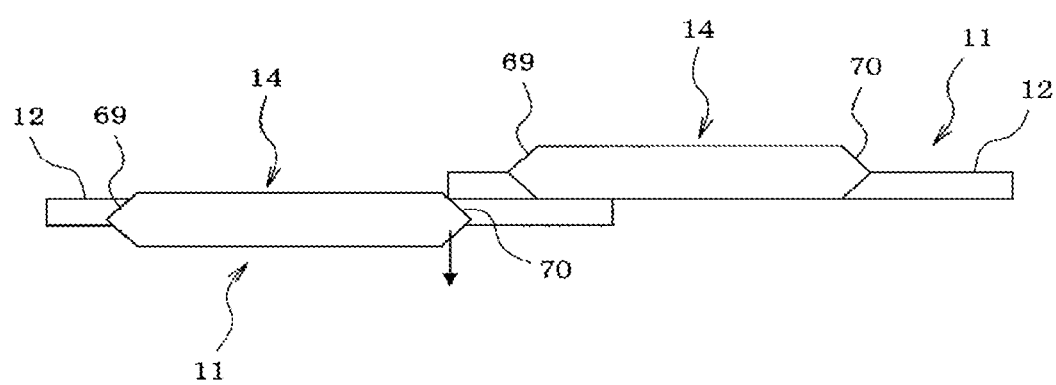
FIG. 16 is a plan view illustrating loading work of tape feeders to the feeder setting table of the second embodiment.

Next, a second embodiment of the present disclosure will be described using FIGS. 15 and 16. However, for portions which are effectively the same as in the first embodiment, the same symbols will be assigned and descriptions will be omitted or simplified, with descriptions mainly being given for portions that are different.

In the first embodiment, the configuration uses link mechanism 15 for the reel displacing mechanism that displaces reel holder 14 in the width direction of feeder main body 12, but in a second embodiment of the present disclosure shown in FIGS. 15 and 16, reel displacing mechanism 71 that displaces reel holder 14 in the width direction of feeder main body 12 is configured as described below.

Slide grooves 72 are formed through in the width direction of feeder main body 12 at a lower end section and both end sections in the front-rear direction (the attachment and removal direction of tape feeder 11) of reel holder 14, slide guide protrusions 73 that extend in the width direction of feeder main body 12 are formed at positions corresponding to the above slide grooves 72 on feeder main body 12, and by slidably engaging slide grooves 72 of reel holder 14 on each of the slide guide protrusions 73, reel holder 14 is held so as to be displaceable in the width direction of feeder main body 12.

With the second embodiment described above, it is possible to obtain the same effects as the first embodiment. Note that, the present disclosure is not limited to the configurations of the first and second embodiments above, and it goes without saying that various changes can be made without departing from the scope of the disclosure, for example, when loading tape feeder 11 on feeder setting table 41, an operator may displace tape reel 13 in the width direction of feeder main body 12 by hand, or the reel displacing mechanism that displaces tape reel 13 in the width direction of feeder main body 12 may be driven by a drive source such as a motor or cylinder.

REFERENCE SIGNS LIST

11: tape feeder; 12: feeder main body; 13: tape reel; 14: reel holder; 15: link mechanism (reel displacing mechanism); 16: reel holding shaft; 17: center hole; 19: upper section cover; 25: lock mechanism; 35: tape feeding mechanism; 36: sprocket; 37: waste tape disposal path; 41: feeder setting table; 42, 43: connector; 44, 45: positioning pin; 48: slot; 51: waste tape disposal opening; 61 to 64: link; 65, 66: shaft; 69, 70: slide taper section; 71: reel displacing mechanism; 72: slide groove; 73: slide guide protruding section

The invention claimed is:

1. A tape feeder comprising:
a feeder main body on which is set a tape reel on which is wound component supply tape; and
a reel displacing mechanism provided on the feeder main body and configured to displace the tape reel in a width direction of the feeder main body, wherein
the reel displacing mechanism is configured to displace the tape reel in the width direction of the feeder main body via an external force, and
the tape reel has a width larger than a width of the feeder main body, and the reel displacing mechanism displaces the tape reel in the width direction of the feeder main body between a position in which a first side surface portion of the tape reel protrudes from a first side surface of the feeder main body, and a position in which a second side surface portion of the tape reel protrudes from a second side surface of the feeder main body.

2. A tape feeder comprising:
a feeder main body on which is set a tape reel on which is wound component supply tape; and
a reel displacing mechanism provided on the feeder main body and configured to displace the tape reel in a width direction of the feeder main body, wherein
the reel displacing mechanism is configured to displace the tape reel in the width direction of the feeder main body via an external force,
the reel displacing mechanism is configured to hold a reel holder displaceably in the width direction of the feeder main body, the reel holder holding the tape reel rotatably,
the tape feeder is attached by being inserted into one of multiple slots of a feeder setting table of a component mounter,
the reel holder includes a first slide taper section on a front side of the reel holder and a second slide taper on a rear side of the reel holder, and
the configuration is such that, when a second tape feeder is inserted into a slot adjacent to a first tape feeder that has been inserted into a slot of the feeder setting table, after inserting the second tape feeder to a position such that a front end section of the second tape feeder contacts the second slide taper section on the rear side of a reel holder of the first tape feeder thereby pushing the reel holder of the first tape feeder to a position that allows the second tape feeder to be inserted, the second tape feeder is inserted to a position such that the first slide taper section of a reel holder of the second tape feeder contacts a rear end section of the first tape feeder thereby pushing the reel holder of the second tape feeder to a position that allows the second feeder to be inserted.

* * * * *